(12) United States Patent
Yoneoka et al.

(10) Patent No.: US 10,726,769 B2
(45) Date of Patent: Jul. 28, 2020

(54) LED DISPLAY DEVICE AND DRIVE DEVICE

(71) Applicant: Mitsubishi Electric Corporation, Tokyo (JP)

(72) Inventors: Isao Yoneoka, Tokyo (JP); Shigenori Shibue, Tokyo (JP); Yoshinori Asamura, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/580,058

(22) PCT Filed: Jul. 1, 2016

(86) PCT No.: PCT/JP2016/069654
§ 371 (c)(1),
(2) Date: Dec. 6, 2017

(87) PCT Pub. No.: WO2017/029895
PCT Pub. Date: Feb. 23, 2017

(65) Prior Publication Data
US 2018/0174504 A1  Jun. 21, 2018

(30) Foreign Application Priority Data

Aug. 20, 2015  (JP) .................................. 2015-162438

(51) Int. Cl.
*G09G 3/32* (2016.01)
*H01L 33/00* (2010.01)
(Continued)

(52) U.S. Cl.
CPC ............. *G09G 3/32* (2013.01); *G09G 3/2014* (2013.01); *G09G 5/02* (2013.01); *H01L 33/00* (2013.01);
(Continued)

(58) Field of Classification Search
None
See application file for complete search history.

(56) References Cited

U.S. PATENT DOCUMENTS

| 5,812,105 A * | 9/1998 | Van de Ven ............... G09F 9/33 257/E25.02 |
| 2006/0290625 A1* | 12/2006 | Sugimoto ............ G09G 3/3413 345/83 |

(Continued)

FOREIGN PATENT DOCUMENTS

| JP | 2000-503133 A | 3/2000 |
| JP | 2002-244619 A | 8/2002 |

(Continued)

OTHER PUBLICATIONS

International Preliminary Report on Patentability and Written Opinion dated Mar. 1, 2018 in PCT/JP2016/069654, with English Translation (PCT/IB/326, PCT/IB/338, PCT/IB/373, and PCT/IB/237 submitted).

(Continued)

*Primary Examiner* — Ifedayo B Iluyomade
(74) *Attorney, Agent, or Firm* — Birch, Stewart, Kolasch & Birch, LLP (57) ABSTRACT

An object is to provide a technique capable of suppressing a power consumption of an LED. An LED display device includes voltage supply parts, which can supply a multiple types of voltages being different from each other and a driver which drives an LED display using the multiple types of voltages. The driver switches a combination of an LED array in a lighting target group which is one of the plurality of groups being subject to lighting-up and the multiple types of voltages which should be supplied in parallel with the LED array, under a time sharing control, and turns on some LEDs, which should be turned on by the voltages which should be supplied to the LED array, in the plurality of LEDs included in the LED array in the lighting target group.

6 Claims, 4 Drawing Sheets

(51) Int. Cl.
*G09G 3/20* (2006.01)
*G09G 5/02* (2006.01)
*G09G 3/3216* (2016.01)

(52) U.S. Cl.
CPC ......... *G09G 3/2003* (2013.01); *G09G 3/3216* (2013.01); *G09G 2300/06* (2013.01); *G09G 2310/021* (2013.01); *G09G 2310/0272* (2013.01); *G09G 2330/021* (2013.01); *G09G 2330/028* (2013.01)

(56) References Cited

U.S. PATENT DOCUMENTS

2009/0153462 A1* 6/2009 Kamada ............ G02F 1/133621
                                                    345/102
2011/0163941 A1    7/2011 Li
2012/0242564 A1* 9/2012 Morishita ............ G09G 3/3413
                                                    345/102

FOREIGN PATENT DOCUMENTS

JP          3564359 B2    9/2004
WO       WO 97/24706 A2  7/1997

OTHER PUBLICATIONS

Extended European Search Report dated Mar. 21, 2019 in corresponding European Patent Application No. 16836887.6.
Office Action issued in corresponding Chinese Application No. 201680046164.5 dated Mar. 26, 2020.

* cited by examiner

LED DISPLAY DEVICE AND DRIVE DEVICE

TECHNICAL FIELD

The present invention relates to a light emitting diode (LED) display device including an LED display that includes LEDs and a drive device driving the LED display.

BACKGROUND ART

LED display devices including LEDs are widely used to display, for example, indoor and outdoor advertisements. These LED display devices have been used as large-sized display devices having pixel pitches of 3 mm or larger, however, in recent years, the LED display devices have reduced cost and narrowed pixel pitches of the LEDs, thus have been brought to market as products having pixel pitches of 1.5 mm and 1.9 mm.

In accordance with the narrowed pixel pitch, the LED constituting one pixel is made up of an extremely small package having a size of 1.0 mm×1.0 mm or smaller. The reduction in the size of the package causes a decrease in a yield in a soldering process due to a reduction in an area of a soldering pad depending on a total number of terminals, and also causes a trouble such as an increase in cost due to a complicated pattern and an increased number of layers in a substrate. Widely used as a method of solving these problems is a package of an anode common in which anodes of the LEDs in red, green, and blue are electrically connected so that a minimal number of terminals are included in the package.

However, a voltage supplied to each of the LEDs in red, green, and blue is common in the anode common, so that when a forward voltage of each LED differs from each other, an electrical power is wastefully consumed in accordance with the difference in the forward voltage, thus a defect such as an increase in the consumed power occurs. When the consumed power increases, an amount of heat generation also increases, thus a defect such as a decrease in a lifetime of the LED due to an increased temperature of LED itself also occurs. Accordingly, proposed is a method of driving a cathode common in which cathodes of the LEDs are electrically connected to achieve a reduction in the consumed power in the LED and a long lifetime of the LED (for example, Patent Document 1).

PRIOR ART DOCUMENTS

Patent Documents

Patent Document 1: Japanese Patent Gazette No. 3564359

SUMMARY

Problem to be Solved by the Invention

However, there is a limited number of manufacturers of a drive circuit corresponding to the cathode common, and a volume efficiency can be hardly obtained from a viewpoint of cost, so that the cathode common results in the cost increase.

The present invention therefore has been made to solve the above-mentioned problems and an object of the present invention is to provide a technique capable of suppressing a power consumption of an LED.

Means to Solve the Problem

An LED display device according to the present invention includes an LED display which includes a plurality of LED arrays grouped into a plurality of groups, voltage supply parts which can supply a multiple types of voltages being different from each other, and a driver which drives the LED display using the multiple types of voltages which the voltage supply parts can supply. Each of the plurality of LED arrays includes a plurality of LEDs in matrix including a plurality of LEDs, which have anodes or cathodes electrically connected to each other and have different emission wavelengths. The driver performs a switching of a combination of the LED array in a lighting target group which is one of the plurality of groups being subject to lighting-up and the multiple types of voltages which should be supplied in parallel with the LED array, under a time sharing control, and turns on some LEDs, which should be turned on by one of the multiple types of voltages which should be supplied to the LED array, and which are complementarily combined with emission wavelengths in each row, in a plurality of rows of LEDs included in the LED array in the lighting target group, in synchronization with the switching.

Effects of the Invention

According to the present invention, a combination of the LED array in the lighting target group and the multiple types of voltages which should be supplied in parallel with the LED array is switched under a time sharing control, and some LEDs, which should be turned on by the voltages which should be supplied to the LED array, in the plurality of LEDs included in the LED array in the lighting target group, is turned on in synchronization with the switching. A power consumption of the LED can be therefore suppressed.

These and other objects, features, aspects and advantages of the present invention will become more apparent from the following detailed description of the present invention when taken in conjunction with the accompanying drawings.

DESCRIPTION OF EMBODIMENT(S)

Embodiment 1

Figure 1:
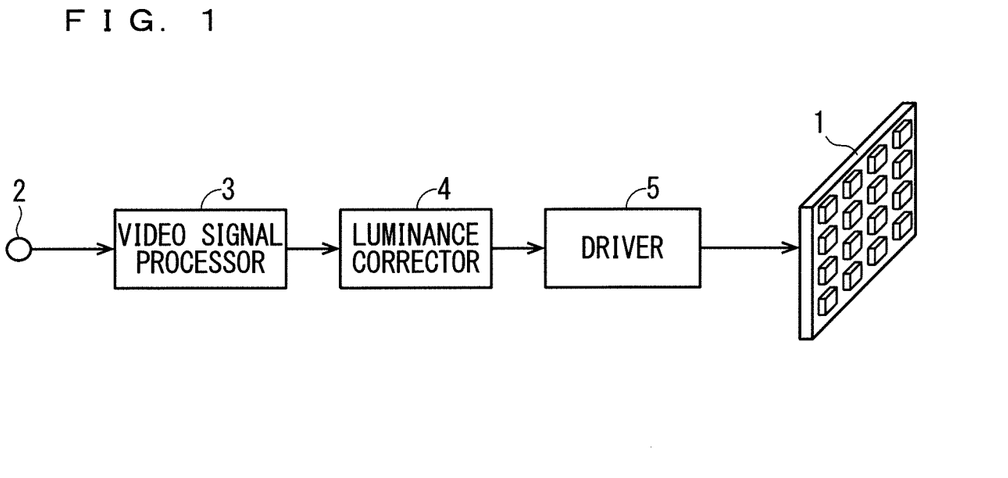
FIG. 1 A block diagram illustrating a configuration of an LED display device according to an embodiment 1.
Figure 2:
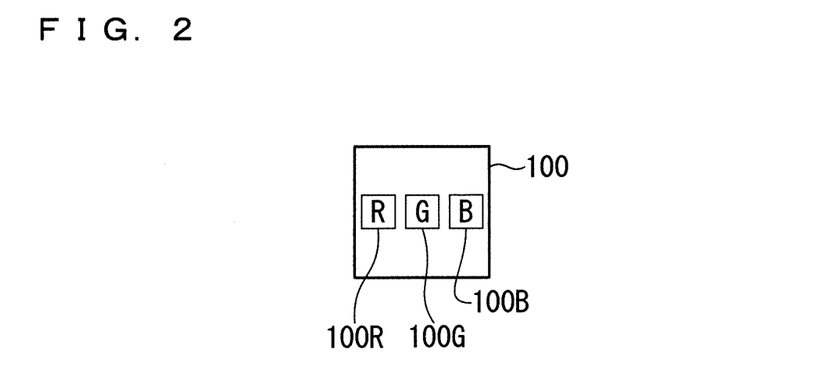
FIG. 2 A block diagram illustrating a configuration of the LED display device according to the embodiment 1.

FIG. 1 and FIG. 2 are block diagrams illustrating a configuration of an LED display device according to the embodiment 1 of the present invention. The LED display device in FIG. 1 includes an LED display 1, an input terminal 2, a video signal processor 3, a luminance corrector 4, and a driver 5 corresponding to a drive device.

Figure 3:
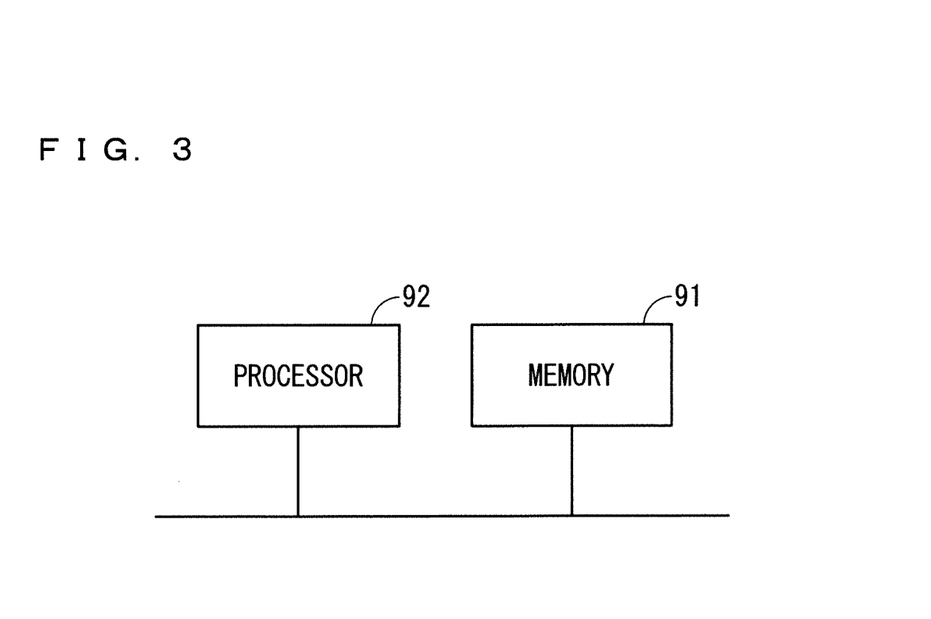
FIG. 3 A block diagram illustrating a hardware configuration of the LED display device according to the embodiment 1.

Firstly, a hardware of each constituent element is described. An LED display panel, for example, is applied to the LED display 1. The video signal processor 3 and the luminance corrector 4 (hereinafter referred to as "the video signal processor 3 etc.") are achieved by, for example, a processor 92 in FIG. 3 executing programs stored in a memory 91.

The memory 91 includes a non-volatile or volatile semiconductor memory, such as a RAM, a ROM, a flash memory, an EPROM, or an EEPROM, a magnetic disk, a flexible disk, an optical disk, a compact disk, a minidisk, and a DVD, for example. The processor 92 includes a central processing unit (CPU), a central processor, a processing unit, an arithmetic unit, a microprocessor, a microcomputer, a processor, and a DSP, for example. The above-mentioned programs cause a computer to execute procedures and methods achieved by the video signal processor 3 etc., and are implemented by a software, a firmware, or a combination of the software and the firmware, for example.

It is not always required that the configuration including the video signal processor 3 etc. be achieved by the operation performed in accordance with software programs. For example, the configuration may be achieved by a signal processing circuit in which the operation is performed by an electric circuit of the hardware. Alternatively, the configuration including the video signal processor 3 etc. may be a combination of a configuration achieved by the software programs and a configuration achieved by the hardware. Similarly, the driver 5 may be implemented by a hardware or a combination of a software and the hardware.

Next, each constituent element of the LED display device in FIG. 1 and FIG. 2 is described.

The LED display 1 is used to display a desired image such as a character and a graphic. The LED display 1 includes a plurality of LED arrays arranged in matrix. In an example in FIG. 1, the LED arrays vertically and laterally arranged four by four, that is equivalent to sixteen in total, are arranged in matrix.

An LED array 100 which is one of the sets of the plurality of LED arrays has three LEDs of an LED 100R in red (R), an LED 100G in green (G), and an LED 100B in blue (B) each having a different emission wavelength. Although not illustrated in FIG. 1 and FIG. 2, the other LED arrays also have the similar configuration.

The input terminal 2 receives a video signal from the outside. In accordance with the video signal received by the input terminal 2, the video signal processor 3 selects a region necessary to perform display and performs processing including the gamma correction. The luminance corrector 4 corrects a luminance of the signal output from the video signal processor 3. The driver 5 drives the LED display 1 based on the output signal corrected by the luminance corrector 4, thereby performing a lighting control (flashing control) of the LED in the LED display 1, for example.

<LED Display 1 and Driver 5>

Figure 4:
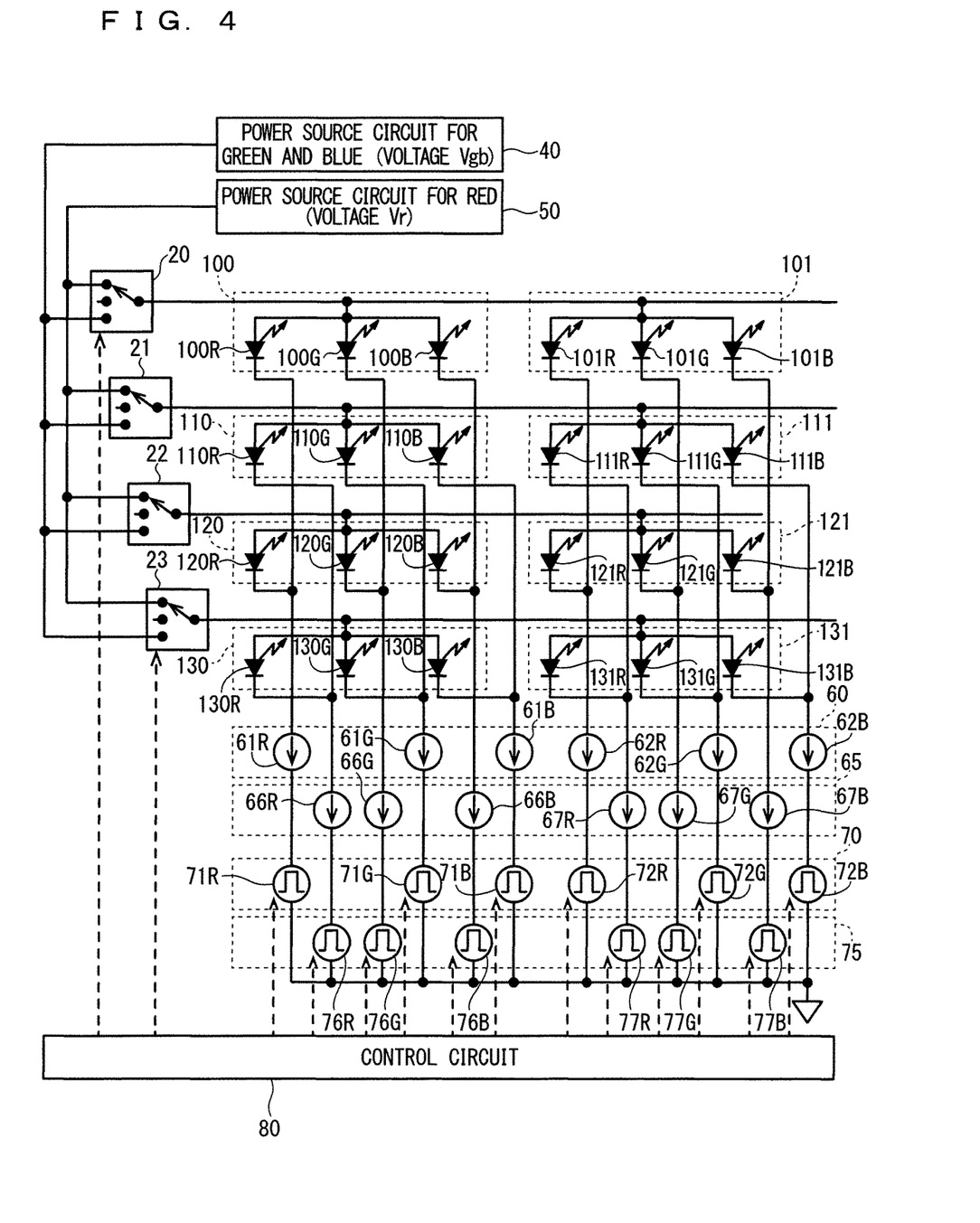
FIG. 4 A circuit diagram illustrating a configuration of the LED display device according to the embodiment 1.

FIG. 4 is a circuit diagram illustrating a configuration of the LED display 1 and the driver 5 according to the present embodiment 1.

The LED display 1 is described firstly. Several lines of LED arrays are generally scanned at a time in the LED display device having a narrowed pixel pitch. FIG. 4 illustrates, as an example thereof, a configuration of a drive control of scanning the LED arrays in two rows and four lines at a time.

In the example in FIG. 4, LED arrays 100 and 101 are the LED arrays in a first line, LED arrays 110 and 111 are the LED arrays in a second line, LED arrays 120 and 121 are the LED arrays in a third line, and LED arrays 130 and 131 are the LED arrays in a fourth line. The LED arrays 100, 110, 120, and 130 are the LED arrays in a first row, and the LED arrays 101, 111, 121, and 131 are the LED arrays in a second row. Total numbers of rows and lines are not limited thereto, but are generally larger than those in the above example.

As described above, the LED array 100 includes the LEDs 100R, 100G, and 100B in R, G, and B, respectively. Anodes of the LEDs 100R, 100G, and 100B are anode common terminals, and are electrically connected to each other. Similarly, the LED array 101 includes LEDs 101R, 101G, and 101B in R, G, and B, respectively whose anodes are electrically connected to each other. The LED arrays 110, 111, 120, 121, 130, and 131 also have the similar configuration.

The driver 5 is described next. The driver 5 includes switches 20, 21, 22, and 23, a power source circuit for green and blue 40, a power source circuit for red 50, constant current circuit blocks 60 and 65, on and off circuit blocks 70 and 75, and a control circuit 80 collectively controlling the above constituent elements in the driver 5.

Herein, each of the power source circuit for green and blue 40 and the power source circuit for red 50 which has an output voltage different from that of the power source circuit for green and blue 40 constitutes a voltage supply part (a power source circuit). Accordingly, the voltage supply parts (power source circuits) can supply a multiple types of voltages Vgb and Vr being different from each other.

The driver 5 drives the LED display 1 using the multiple types of voltages Vgb and Vr which can be supplied from the voltage supply parts (the power source circuit for green and blue 40 and the power source circuit for red 50). In the present embodiment 1, the voltage supply parts (the power source circuit for green and blue 40 and the power source circuit for red 50) are included in the driver 5, but may be separated from the driver 5.

Each constituent element of the driver 5 is described next.

The anode common terminals of the LED arrays 100 and 101 are connected to the switch 20. When the switch 20 is switched to the power source circuit for green and blue 40 or the power source circuit for red 50 under control of the control circuit 80, the LED arrays 100 and 101 are subject to lighting-up, and the LEDs in the LED arrays 100 and 101 can be turned on. In the meanwhile, when the switch 20 is switched to neither the power source circuit for green and blue 40 nor the power source circuit for red 50 under control of the control circuit 80, the LEDs in the LED arrays 100 and 101 are turned off.

Similarly, the anode common terminals of the LED arrays 110 and 111 are connected to the switch 21. When the switch 21 is switched to the power source circuit for green and blue 40 or the power source circuit for red 50 under control of the control circuit 80, the LED arrays 110 and 111 are subject to lighting-up, and the LEDs in the LED arrays 110 and 111 can be turned on. In the meanwhile, when the switch 21 is switched to neither the power source circuit for green and blue 40 nor the power source circuit for red 50 under control of the control circuit 80, the LEDs in the LED arrays 110 and 111 are turned off.

Similarly, the anode common terminals of the LED arrays 120 and 121 are connected to the switch 22, and the anode common terminals of the LED arrays 130 and 131 are connected to the switch 23.

As described hereinafter, the LED arrays 100, 101, 110, 111, 120, 121, 130, and 131 are grouped into two groups of a first group LED arrays 100, 101, 110, and 111 (also referred to as "the first group 100 to 111" hereinafter) and a second group LED arrays 120, 121, 130, and 131 (also referred to as "the second group 120 to 131" hereinafter).

When the first group 100 to 111 is a lighting target group (the group subject to lighting-up), the one of the switches 20 and 21 is switched to the power source circuit for green and blue 40, and the other one of them is switched to the power source circuit for red 50. As a result, the LEDs in the first group 100 to 111 can be turned on. In the above case, the switches 22 and 23 are switched to an off-state voltage. As a result, the LEDs in the second group 120 to 131 are turned off.

In the meanwhile, when the second group 120 to 131 is a lighting target group, the one of the switches 22 and 23 is switched to the power source circuit for green and blue 40, and the other one of them is switched to the power source circuit for red 50. As a result, the LEDs in the second group 120 to 131 can be turned on. In the above case, the switches 20 and 21 are switched to the off-state voltage. As a result, the LEDs in the first group 100 to 111 are turned off.

The constant current circuit block 60 includes a constant current circuit 61R, a constant current circuit 61G, a constant current circuit 61B, a constant current circuit 62R, a constant current circuit 62G, and a constant current circuit 62B.

The constant current circuit 61R is electrically connected to the cathodes of the LED 100R in the first line and the LED 120R in the third line, the constant current circuit 61G is electrically connected to the cathodes of the LED 110G in the second line and the LED 130G in the fourth line, and the constant current circuit 61B is electrically connected to the cathodes of the LED 110B in the second line and the LED 130B in the fourth line. The constant current circuit 62R is electrically connected to the cathodes of the LED 101R in the first line and the LED 121R in the third line, the constant current circuit 62G is electrically connected to the cathodes of the LED 111G in the second line and the LED 131G in the fourth line, and the constant current circuit 62B is electrically connected to the cathodes of the LED 111B in the second line and the LED 131B in the fourth line.

The constant current circuit block 65 includes a constant current circuit 66R, a constant current circuit 66G, a constant current circuit 66B, a constant current circuit 67R, a constant current circuit 67G, and a constant current circuit 67B.

The constant current circuit 66R is electrically connected to the cathodes of the LED 110R in the second line and the LED 130R in the fourth line, the constant current circuit 66G is electrically connected to the cathodes of the LED 100G in the first line and the LED 120G in the third line, and the constant current circuit 66B is electrically connected to the cathodes of the LED 100B in the first line and the LED 120B in the third line. The constant current circuit 67R is electrically connected to the cathodes of the LED 111R in the second line and the LED 131R in the fourth line, the constant current circuit 67G is electrically connected to the cathodes of the LED 101G in the first line and the LED 121G in the third line, and the constant current circuit 67B is electrically connected to the cathodes of the LED 101B in the first line and the LED 121B in the third line.

The on and off circuit block 70 includes on and off circuits 71R, 71G, 71B, 72R, 72G, and 72B.

The on and off circuit 71R is electrically connected to the cathodes of the LEDs 100R and 120R via the constant current circuit 61R, the on and off circuit 71G is electrically connected to the cathodes of the LEDs 110G and 130G via the constant current circuit 61G, and the on and off circuit 71B is electrically connected to the cathodes of the LEDs 110B and 130B via the constant current circuit 61B. In a manner similar to the above configuration, the on and off circuits 72R, 72G, and 72B are electrically connected to the cathodes of the LEDs in red, green, and blue via the constant current circuits 62R, 62G, and 62B. The on and off circuits 71R, 71G, 71B, 72R, 72G, and 72B described above turn on and off the electrical connection under control of the control circuit 80.

The on and off circuit block 75 includes on and off circuits 76R, 76G, 76B, 77R, 77G, and 77B.

The on and off circuit 76R is electrically connected to the cathodes of the LEDs 110R and 130R via the constant current circuit 66R, the on and off circuit 76G is electrically connected to the cathodes of the LEDs 100G and 120G via the constant current circuit 66G, and the on and off circuit 76B is electrically connected to the cathodes of the LEDs 100B and 120B via the constant current circuit 66B. In a manner similar to the above configuration, the on and off circuits 77R, 77G, and 77B are electrically connected to the cathodes of the LEDs in red, green, and blue via the constant current circuits 67R, 67G, and 67B. The on and off circuits 76R, 76G, 76B, 77R, 77G, and 77B described above turn on and off the electrical connection under control of the control circuit 80.

The control circuit 80 controls the switching of the switches 20, 21, 22, and 23 under time sharing control. The control circuit 80 individually performs the on and off control of the on and off circuits 71R, 71G, 71B, 72R, 72G, 72B, 76R, 76G, 76B, 77R, 77G, and 77B, in synchronization with the switching, thereby individually controlling on and off of the current flowing in the LED and then the lighting-up and lighting-off of the LED.

In the present embodiment 1, the control circuit 80 performs the lighting control of the LED under control of pulse width modulation (PWM) using a duty ratio (a ratio of an on period per pulse period). Thus, the lighting control of the LED performed by the control circuit 80 is the flashing control of the LED in a precise sense, however, since the pulse period is extremely short, human eyes sense the flashing of the LED as the lighting-up of the LED. In such a PWM control, the ratio of the on period increases as the duty ratio gets larger, thus a luminance of the LED sensed by the human eyes increases.

The control circuit 80 performs not only the control described above but also the switching control of the switches 20, 21, 22, and 23.

The driver 5 having the above configuration controls the switching of the switches 20, 21, 22, and 23 under the time sharing control, thereby switching a combination of the LED array in the lighting target group and of the multiple types of voltages Vgb and Vr which should be supplied in parallel with the LED array, under the time sharing control. In the description hereinafter, the combination is described as <the LED array in the lighting target group, the voltage which should be supplied to the LED array>.

Although described in detail hereinafter, as an example of such a switching, the driver 5 according to the present embodiment 1 switches the combination to <the LED array 100 and the LED array 101, Vr> and <the LED array 110 and the LED array 111, Vgb>, and subsequently switches the combination to <the LED array 100 and the LED array 101, Vgb> and <the LED array 110 and the LED array 111, Vr>. Subsequently, the driver 5 according to the present embodiment 1 performs a switching of the combination similar to the combination described above except that the LED arrays 100, 101, 110, and 111 are replaced with the LED 120, 121, 130, and 131.

Then, the driver 5 turns on some LEDs which should be turned on by the voltage which should be supplied to the LED array in the plurality of LEDs included in the LED array in the lighting target group, in synchronization with the switching, while performing the switching described above. When the voltage which should be supplied to the LED array is the voltage Vr of the power source circuit for red 50, the driver 5 according to the present embodiment 1 turns on the LEDs in red in the LED array as some LEDs described above. When the voltage which should be supplied to the LED array is the voltage Vgb of the power source circuit for green and blue 40, the driver 5 according to the present embodiment 1 turns on the LEDs in green and blue in the LED array as some LEDs described above. The lighting control of the LED is described in detail hereinafter.

<Voltage in Voltage Supply Part>

The voltages Vgb and Vr in the voltage supply parts (the power source circuit for green and blue 40 and the power source circuit for red 50) are described. An example of materials of the LEDs in R, G, and B according to the present embodiment 1 and forward voltages is described in Table 1.

TABLE 1

|  | Material | Forward Voltage (V) |
|---|---|---|
| Red (R) | AlGaInP | 2.4 (in 10 mA) |
| Green (G) | InGaN | 3.4 (in 10 mA) |
| Blue (B) | InGaN | 3.4 (in 10 mA) |

As shown in Table 1, the forward voltage in the LED in green (G) and the forward voltage in the LED in blue (B) are approximately the same, however, there is a voltage difference of approximately 1.0 V between the forward voltage in the LED in red (R) and the forward voltages in the LED in green (G) and the LED in blue (B). This voltage difference causes a power loss at a time of the anode common connection. In view of the above fact, in the present embodiment 1, in order to turn on a desired LED in R, the control circuit 80 switches the corresponding switch to the power source circuit for red 50, and supplies the voltage thereof to the desired LED in R. In the meanwhile, in order to turn on desired LEDs in G and B, the control circuit 80 switches the corresponding switch to the power source circuit for green and blue 40, and supplies the voltages thereof to the desired LEDs in G and B.

Figure 5:
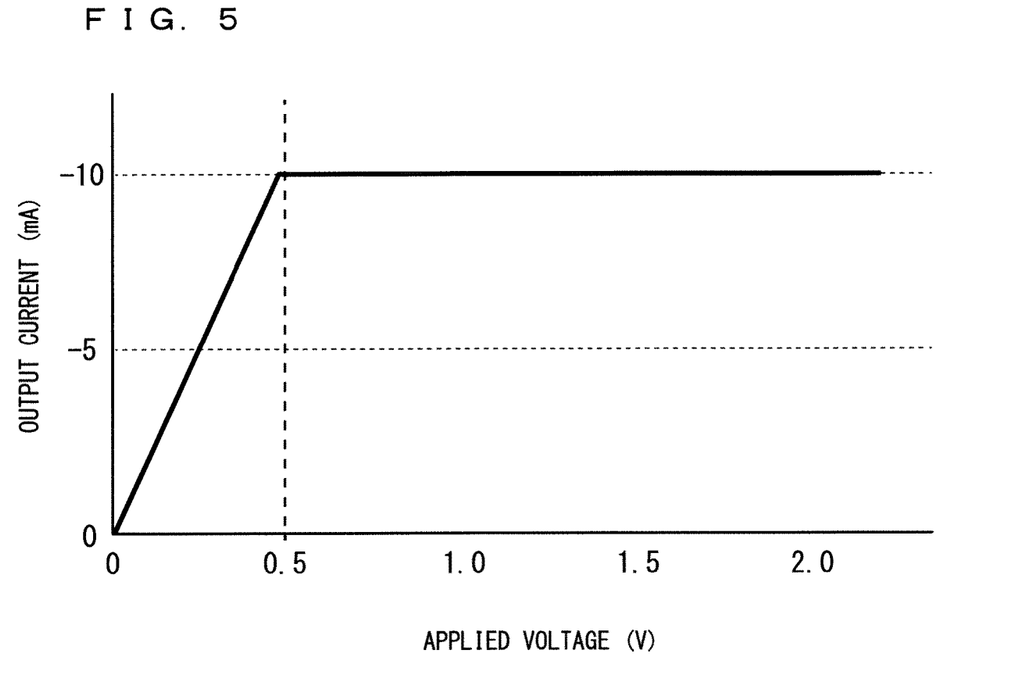
FIG. 5 A diagram illustrating an example of a relationship between an applied voltage and an output current in a constant current circuit.

FIG. 5 is a diagram illustrating an example of a relationship between an applied voltage and an output current in the constant current circuits 61R, 62R, 66R, and 67R. The constant current circuit 61R and the like have a function of flowing a specified current (a current which is specified) regardless of the applied voltage. However, the applied voltage of the constant current circuit 61R and the like needs to be equal to or larger than a voltage (0.5 V in the case of FIG. 5), referred to as a knee voltage, which depends on the constant current circuit 61 and the like, as illustrated in FIG. 5, so that the above function is effective. Thus, in the configuration of flowing the current of 10 mA in the LED in R, the voltage of 2.9 V or larger in which the knee voltage is added to the forward voltage 2.4 V, for example, is applied as the voltage Vr of the power source circuit for red 50. However, the voltage slightly larger than 2.9 V, for example, is preferably applied as the voltage Vr in view of a variation.

For the similar reason, in the configuration of flowing the current of 10 mA in the LEDs in G and B, the voltage of 3.9 V or larger in which the knee voltage 0.5 V is added to the forward voltage 3.4 V, for example, is applied as the voltage Vgb of the power source circuit for green and blue 40. However, the voltage slightly larger than 3.9 V, for example, is preferably applied as the voltage Vgb in view of a variation.

As described above, in the present embodiment 1, the multiple types of voltages which can be supplied from the voltage supply parts include the voltage Vgb as a second voltage and the voltage Vr as a first voltage smaller than the second voltage.

<Lighting Control of LED>

Figure 6:
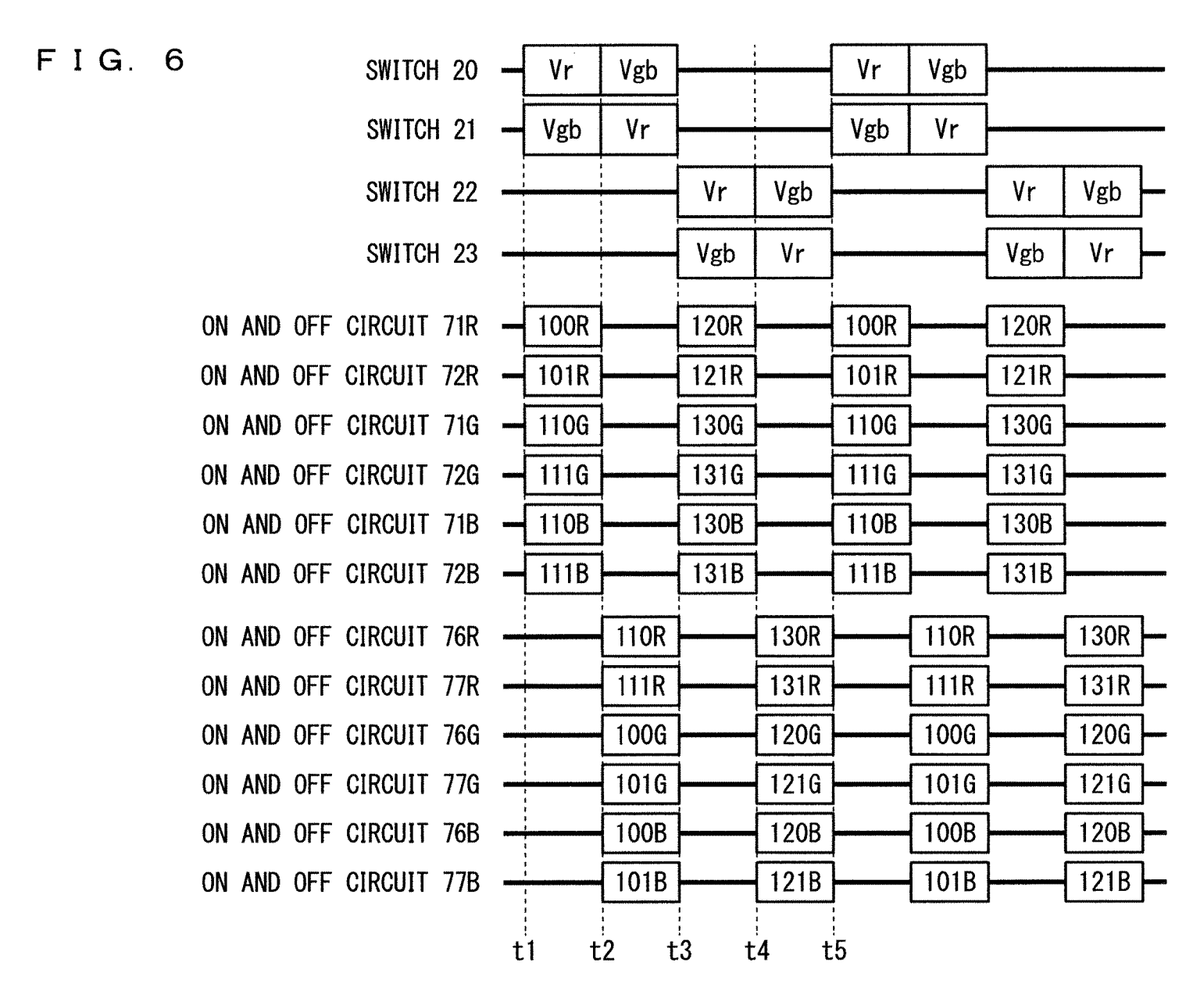
FIG. 6 A timing chart illustrating an operation of the LED display device according to the embodiment 1.

FIG. 6 is a timing chart illustrating the switching of the switch and the lighting control of the LED according to the present embodiment 1. FIG. 6 illustrates the supplied voltages supplied from the voltage supply parts to the LEDs via the switches 20 to 23 and the LEDs which are turned on. Each of the switches 20 to 23 can supply one of the three voltages (the voltage Vr of the power source circuit for red 50, the voltage Vgb of the power source circuit for green and blue 40, and off-state voltage) to the LED array as the supplied voltage.

The control circuit 80 performs the control so the LED arrays 100 to 131 grouped into the plurality of groups sequentially emit light in a time-shared manner in accordance with the timing chart illustrated in FIG. 5.

Firstly, in a period t1 to t2, the control circuit 80 applies the first group LED arrays 100, 101, 110, and 111 as the lighting target group, and switches the combination to <the LED array 100 and the LED array 101, Vr> and <the LED array 110 and the LED array 111, Vgb>.

Specifically, the switch 20 is switched to the voltage Vr, the switch 21 is switched to the voltage Vgb, and the switches 22 and 23 are switched to the off-state voltage. The control circuit 80 performs the PWM control on the on and off circuits 71R and 72R and also performs the PWM control on the constant current circuits 61R and 62R. As a result, the LEDs 100R and 101R are turned on. Similarly, the control circuit 80 performs the PWM control on the on and off circuits 71G, 72G, 71B, and 72B and also performs the PWM control on the constant current circuits 61G, 62G, 61B, and 62B. As a result, the LEDs 110G, 111G, 110B, and 111B are turned on.

At this time, the control circuit 80 (the driver 5) switches off the on and off circuits 76G, 76B, 77G, and 77B, thereby turning off the LEDs 100G and 100B other than the LED 100R in the LED array 100 and the LEDs 101G and 101B other than the LED 101R in the LED array 101. Similarly, the control circuit 80 (the driver 5) switches off the on and off circuits 76R and 77R, thereby turning off the LED 110R other than the LEDs 110G and 110B in the LED array 110 and the LED 111R other than the LEDs 111G and 111B in the LED array 111. Since the switches 22 and 23 are switched to the off-state voltage, the LEDs in the second group LED arrays 120, 121, 130, and 131 are in an off-state.

Next, in a period t2 to t3, the control circuit 80 applies the first group LED arrays 100, 101, 110, and 111 as the lighting target group, and switches the combination to <the LED array 100 and the LED array 101, Vgb> and <the LED array 110 and the LED array 111, Vr>.

Specifically, the switch 20 is switched to the voltage Vgb, the switch 21 is switched to the voltage Vr, and the switches 22 and 23 remain in the off-state voltage. The control circuit 80 performs the PWM control on the on and off circuits 76R and 77R and also performs the PWM control on the constant current circuits 66R and 67R. As a result, the LEDs 110R and 111R are turned on. Similarly, the control circuit 80 performs the PWM control on the on and off circuits 76G, 77G, 76B, and 77B and also performs the PWM control on the constant current circuits 66G, 67G, 66B, and 67B. As a result, the LEDs 100G, 101G, 100B, and 101B are turned on.

At this time, the control circuit 80 (the driver 5) switches off the on and off circuits 71G, 71B, 72G, and 72B, thereby turning off the LEDs 110G and 110B other than the LED 110R in the LED array 110 and the LEDs 111G and 111B other than the LED 111R in the LED array 111. Similarly, the control circuit 80 (the driver 5) switches off the on and off circuits 71R and 72R, thereby turning off the LED 100R other than the LEDs 100G and 100B in the LED array 100 and the LED 101R other than the LEDs 101G and 101B in the LED array 101. Since the switches 22 and 23 are switched to the off-state voltage, the LEDs in the second group LED arrays 120, 121, 130, and 131 are in the off-state.

Next, in a period t3 to t4, the control circuit 80 applies the second group LED arrays 120, 121, 130, and 131 as the lighting target group, and switches the combination to <the LED array 120 and the LED array 121, Vr> and <the LED array 130 and the LED array 131, Vgb>.

Specifically, the switch 22 is switched to the voltage Vr, the switch 23 is switched to the voltage Vgb, and the switches 20 and 21 are switched to the off-state voltage. The control circuit 80 performs the PWM control on the on and off circuits 71R and 72R and also performs the PWM control on the constant current circuits 61R and 62R. As a result, the LEDs 120R and 121R are turned on. Similarly, the control circuit 80 performs the PWM control on the on and off circuits 71G, 72G, 71B, and 72B and also performs the PWM control on the constant current circuits 61G, 62G, 61B, and 62B. As a result, the LEDs 130G, 131G, 130B, and 131B are turned on.

At this time, the control circuit 80 (the driver 5) switches off the on and off circuits 76G, 76B, 77G, and 77B, thereby turning off the LEDs 120G and 120B other than the LED 120R in the LED array 120 and the LEDs 121G and 121B other than the LED 121R in the LED array 121. Similarly, the control circuit 80 (the driver 5) switches off the on and off circuits 76R and 77R, thereby turning off the LED 130R other than the LEDs 130G and 130B in the LED array 130 and the LED 131R other than the LEDs 131G and 131B in the LED array 131. Since the switches 20 and 21 are switched to the off-state voltage, the LEDs in the first group LED arrays 100, 101, 110, and 111 are in the off-state.

Next, in a period t4 to t5, the control circuit 80 applies the second group LED arrays 120, 121, 130, and 131 as the lighting target group, and switches the combination to <the LED array 120 and the LED array 121, Vgb> and <the LED array 130 and the LED array 131, Vr>.

Specifically, the switch 22 is switched to the voltage Vgb, the switch 23 is switched to the voltage Vr, and the switches 20 and 21 remain in the off-state voltage. Then, the control circuit 80 performs the PWM control on the on and off circuits 76R and 77R and also performs the PWM control on the constant current circuits 66R and 67R As a result, the LEDs 130R and 131R are turned on. Similarly, the control circuit 80 performs the PWM control on the on and off circuits 76G, 77G, 76B, and 77B and also performs the PWM control on the constant current circuits 66G, 67G, 66B, and 67B. As a result, the LEDs 120G, 121G, 120B, and 121B are turned on.

At this time, the control circuit 80 (the driver 5) switches off the on and off circuits 71G, 71B, 72G, and 72B, thereby turning off the LEDs 130G and 130B other than the LED 130R in the LED array 130 and the LEDs 131G and 131B other than the LED 131R in the LED array 131. Similarly, the control circuit 80 (the driver 5) switches off the on and off circuits 71R and 72R, thereby turning off the LED 120R other than the LEDs 120G and 120B in the LED array 120 and the LED 121R other than the LEDs 121G and 121B in the LED array 121. Since the switches 20 and 21 are switched to the off-state voltage, the LEDs in the first group LED arrays 100, 101, 110, and 111 are in the off-state.

The control similar to the above description is performed repeatedly in a period t5 and subsequent periods. Thus, the lighting-up of the LEDs 100R, 101R, 110G, 111G, 110B, and 111B, the lighting-up of the LEDs 110R, 111R, 100G, 101G, 100B, and 101B, the lighting-up of the LEDs 120R, 121R, 130G, 131G, 130B, and 131B, and the lighting-up of the LEDs 130R, 131R, 120G, 121G, 120B, and 121B are performed repeatedly in sequence. The luminance in lighting-up is under PWM control, and a desired video is displayed on the LED display 1.

Herein, a consumed power is compared between a conventional LED display device of an anode common and the LED display device according to the present embodiment 1. The consumed power in the LED display device according to the present embodiment 1 is smaller than that in the conventional LED display device by an electrical power substantially equal to a value obtained by an expression of a difference of a power-supply voltage $1(V)\times10$ (A)×the duty ratio of the PWM control×the number of pixels. Herein, when the duty ratio of 0.25 and the number of pixels of two millions or more in view of full high-definitions are assigned to the above expression as an example, the LED display device according to the present embodiment 1 can reduce the consumed power of approximately 5 KW.

Conclusion of Embodiment 1

The LED display device according to the present embodiment 1 described above turns on some LEDs which should be turned on by the voltage which should be supplied to the LED array in the plurality of LEDs included in the LED array in the lighting target group. Accordingly, the appropriate voltage can be applied to each of the LEDs in R, G, and B, thus the wasteful consumption of the power can be suppressed, and the consumed power can be reduced. The heat generation in the control circuit 80 (the driver 5), for example, can be suppressed, thus the lifetime of the LED can be extended, and the reliability is enhanced. The LED arrays are grouped into the plurality of groups (the two groups in the above description), thus the LEDs can be parallelly turned on the different LED array. Accordingly, the number of LEDs turned on under the time sharing control can be kept constant, thus a flicker phenomenon, for example, can also be suppressed.

As described above, the present invention can be applied to the anode common type LED drive circuit which many manufactures commercialize, thus is also advantageous in availability and cost. However, even when the configuration similar to that in the above description is applied to the cathode common type LED drive circuit in which the cathode of the LEDs in R, G, and B are electrically connected to each other, the effect similar to that in the above description can be obtained.

In the embodiment 1 described above, the two types of power source circuits (the power source circuit for green and blue 40 and the power source circuit for red 50) are applied to the voltage supply part. However, the two types of power source circuits are not necessary, but three types of power source circuits may be applied to the voltage supply part so that the three types of voltages can be individually supplied to correspond to R, G, and B. Although the combination of the number of LED arrays is 2×4 in FIG. 4, the combination is not limited thereto, but the combination of the optional number may be applied. In the configuration of FIG. 4, the time sharing control (the time sharing processing) is performed on the light emission of the LED in the four lines of LED arrays at a time. However, the configuration is not limited thereto, but the time sharing control (the time sharing processing) may be performed on the LEDs in an optional number of lines (32 lines, for example) at a time to correspond to the number of LEDs constituting the LED panel.

According to the present invention, the above embodiments can be appropriately varied or omitted within the scope of the invention.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1 LED display, 5 driver, 40 power source circuit for green and blue, 50 power source circuit for red, 100, 101, 110, 111, 120, 121, 130, 131 LED array, 100R to 100B, 101R to 101B, 110R to 110B, 111R to 111B, 120R to 120B, 121R to 121B, 130R to 130B, 131R to 131B LED

The invention claimed is:

1. An LED display device, comprising:
an LED display including a plurality of LED arrays grouped into a plurality of groups;
voltage supply parts which can supply multiple types of voltages being different from each other; and
a driver driving said LED display using said multiple types of voltages which said voltage supply parts can supply, wherein
each of said plurality of LED arrays includes a plurality of LEDs in matrix, which have anodes or cathodes electrically connected to each other and have different emission wavelengths,
said driver performs a switching of a combination of said LED array in a lighting target group which is one of said plurality of groups being subject to lighting-up and said multiple types of voltages which should be supplied in parallel with said LED array, under a time sharing control, and
said driver turns on some LEDs, which should be turned on by one of said multiple types of voltages which should be supplied to said LED array, and which are complementarily combined with emission wavelengths in each row, in a plurality of rows of LEDs included in said LED array in said lighting target group, in synchronization with said switching of said multiple types of voltages, and whereby light of said emission wavelengths complementarily combined is emitted in the same period, and in the period that said some LEDs in said lighting target group are turned on, turns off said plurality of rows of LEDs other than said some LEDs in said lighting target group and all the LEDs other than LEDs in said lighting target group.

2. The LED display device according to claim 1, wherein said plurality of LEDs include LEDs in red, green, and blue.

3. The LED display device according to claim 2, wherein said multiple types of voltages includes a first voltage and a second voltage, and
said driver turns on said LEDs in red included in said LED array as said some LEDs when said voltage which should be supplied to said LED array is said first voltage, and turns on said LEDs in green and blue included in said LED array as said some LEDs when said voltage which should be supplied to said LED array is said second voltage.

4. A drive device which drives, using multiple types of voltages being different from each other, an LED display including a plurality of LED arrays grouped into a plurality of groups, wherein
each of said plurality of LED arrays includes a plurality of LEDs, which have anodes or cathodes electrically connected to each other and have different emission wavelengths,
said drive device performs a switching of a combination of said LED array in a lighting target group which is one of said plurality of groups being subject to lighting-up and said multiple types of voltages which should be supplied in parallel with said LED array, under a time sharing control, and
said drive device turns on some LEDs, which should be turned on by one of said multiple types of voltages which should be supplied to said LED array, and which are complementarily combined with emission wavelength in each row, in a plurality rows of LEDs included in said LED array in said lighting target group, in synchronization with said switching of said multiple types of voltages, and whereby light of said emission wavelengths complementarily combined is emitted in the same period, and in the period that said some LEDs in said lighting target group are turned on, turns off said plurality of rows of LEDs other than said some LEDs in said lighting target group and all the LEDs other than LEDs in said lighting target group.

5. A LED display device according to claim 1, wherein said multiple types of voltages are two kinds of voltages and a switching cycle of said lighting target group corresponds to twice as that of said multiple types of voltages.

6. A drive device according to claim 4, wherein said multiple types of voltages are two kinds of voltages and a switching cycle of said lighting target group corresponds to twice as that of said multiple types of voltages.

* * * * *